United States Patent
Meunier-Beillard et al.

(10) Patent No.: US 7,554,138 B2
(45) Date of Patent: Jun. 30, 2009

(54) METHOD OF MANUFACTURING A STRAINED SEMICONDUCTOR LAYER, METHOD OF MANUFACTURING A SEMICONDUCTOR DEVICE AND SEMICONDUCTOR SUBSTRATE SUITABLE FOR USE IN SUCH A METHOD INCLUDING HAVING A THIN DELTA PROFILE LAYER OF GERMANIUM CLOSE TO THE BOTTOM OF THE STRAINED LAYER

(75) Inventors: Philippe Meunier-Beillard, Leuven (BE); Claire Ravit, Leuven (BE)

(73) Assignee: NXP B.V., Eindhoven (NL)

( * ) Notice: Subject to any disclaimer, the term of this patent is extended or adjusted under 35 U.S.C. 154(b) by 24 days.

(21) Appl. No.: 11/629,684

(22) PCT Filed: Jun. 7, 2005

(86) PCT No.: PCT/IB2005/051850

§ 371 (c)(1),
(2), (4) Date: Dec. 15, 2006

(87) PCT Pub. No.: WO2005/124837

PCT Pub. Date: Dec. 29, 2005

(65) Prior Publication Data
US 2007/0246742 A1    Oct. 25, 2007

(30) Foreign Application Priority Data
Jun. 16, 2004    (EP) .................................. 04102752

(51) Int. Cl.
*H01L 29/80*    (2006.01)
*H01L 31/112*    (2006.01)
*H01L 29/792*    (2006.01)
*H01L 31/117*    (2006.01)
*H01L 21/8238*    (2006.01)
*H01L 21/22*    (2006.01)
*H01L 21/38*    (2006.01)

(52) U.S. Cl. .................. 257/279; 257/326; 257/616; 438/222; 438/569; 438/933

(58) Field of Classification Search .................. 438/222, 438/569, 933; 257/279, 326, 616, E29.193
See application file for complete search history.

(56) References Cited

U.S. PATENT DOCUMENTS

| 6,900,103 B2 * | 5/2005 | Fitzgerald .................. 438/285 |
| 2002/0123183 A1 * | 9/2002 | Fitzgerald .................. 438/199 |
| 2003/0131787 A1 * | 7/2003 | Linares et al. .................. 117/93 |

FOREIGN PATENT DOCUMENTS

| DE | 37 31 000 | 3/1989 |
| EP | 0 307 850 | 3/1989 |
| EP | 1 020 900 | 7/2000 |

OTHER PUBLICATIONS

Carns T K et al: "A Novel High Speed, High Density SRAM Cell Utilizing A Bistable GESI/SI Tunnel Diode"; Electron Devices Meeting 1994; Tech. Digest San Francisco Dec. 11-14, 1994; pp. 381-384.

* cited by examiner

*Primary Examiner*—William M. Brewster

(57) ABSTRACT

The invention relates to a method of manufacturing a semiconductor strained layer and to a method of manufacturing a semiconductor device (10) in which a semiconductor body (11) of silicon is provided, at a surface thereof, with a first semiconductor layer (1) having a lattice of a mixed crystal of silicon and germanium and a thickness such that the lattice is substantially relaxed, and on top of the first semiconductor layer (1) a second semiconductor layer (2) is provided comprising strained silicon, in which layer (2) a part of the semiconductor device (10) is formed, and wherein measures are taken to avoid reduction of the effective thickness of the strained silicon layer (2) during subsequent processing needed to form the semiconductor device (10), said measures comprising the use of a third layer (3) having a lattice of a mixed crystal of silicon and germanium. According to the invention, the third layer (3) is thin and positioned within the second layer (2) close to the interface between the first and second semiconductor layers (1,2). In this way the resulting thickness of the strained silicon layer (2), after subsequent formation of the MOSFET, can be increased, resulting in a MOSFET with better high-frequency properties. The invention also comprises a device obtained with a method according to the invention and a semiconductor substrate structure suitable for use in such a method.

17 Claims, 4 Drawing Sheets

Figure 1:
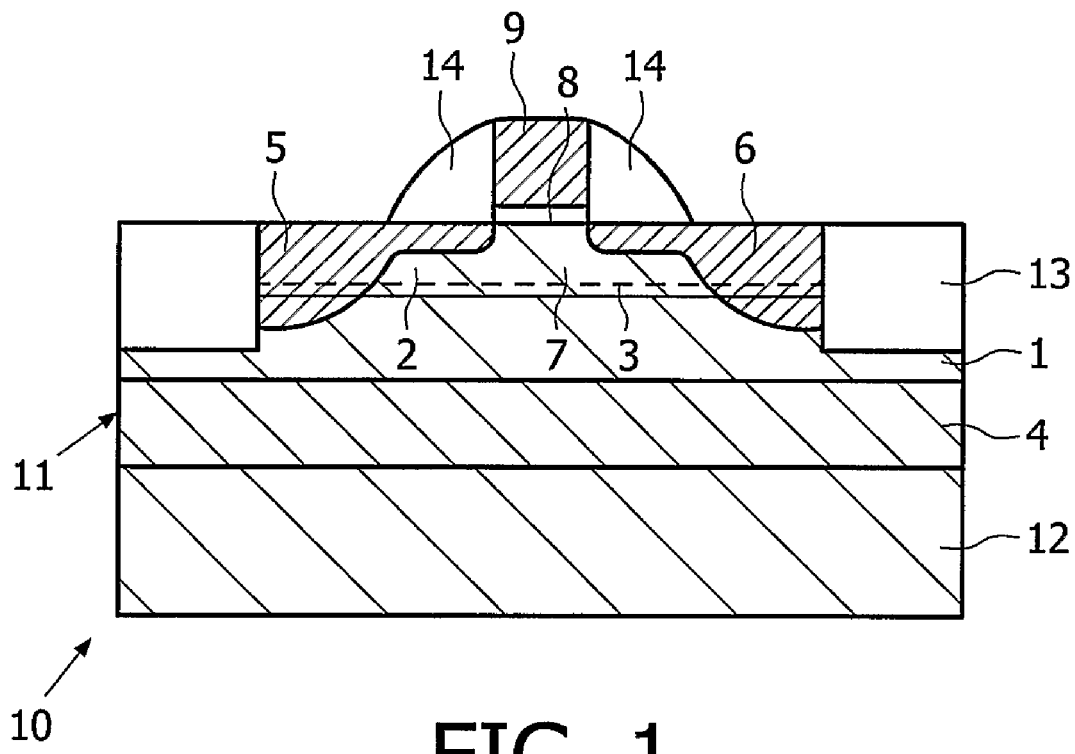

METHOD OF MANUFACTURING A STRAINED SEMICONDUCTOR LAYER, METHOD OF MANUFACTURING A SEMICONDUCTOR DEVICE AND SEMICONDUCTOR SUBSTRATE SUITABLE FOR USE IN SUCH A METHOD INCLUDING HAVING A THIN DELTA PROFILE LAYER OF GERMANIUM CLOSE TO THE BOTTOM OF THE STRAINED LAYER

The invention relates to a method of manufacturing a strained semiconductor layer, the strained semiconductor layer having a critical layer thickness for stress relaxation.

The invention further relates to a method of manufacturing a semiconductor device in which a semiconductor body of silicon is provided, at a surface thereof, with a first semiconductor layer having a lattice of a mixed crystal of silicon and germanium and a thickness such that the lattice is substantially relaxed, and on top of the first semiconductor layer a second semiconductor layer is provided comprising strained silicon, in which layer a part of the semiconductor device is formed, and wherein measures are taken to avoid reduction of the effective thickness of the strained silicon layer during subsequent processing needed to form the semiconductor device, said measures comprising the use of a third layer having a lattice of a mixed crystal of silicon and germanium. The invention also relates to a semiconductor device obtained with such a method and a semiconductor substrate suitable for use in such a method.

Such a method is very suitable for making devices that profit from the strain in the second semiconductor layer. Since the electron and hole mobilities in strained silicon are considerably higher than in un-strained silicon, said method is very suitable for making MOSFET (=Metal Oxide Semiconductor Field Effect Transistor) devices that have an improved high-frequency behavior.

A method as mentioned in the opening paragraph is known from US patent application US 2003/0013323 A1 that was published on Jan. 16, 2003. Therein such a method is described in which a MOSFET is made using a strained silicon layer on top of a strain-relaxed SiGe layer. On top of the strained silicon layer a SiGe cap layer is deposited and on the latter a second strained Si-containing layer is deposited. In this way, consumption of the first strained silicon layer is limited since the SiGe cap layer and the second strained silicon layer are sacrificed at the location of the gate of the MOSFET to be formed.

A drawback of such a method is that the method is rather complicated since the local removal of the SiGe cap layer (and the second strained silicon layer) requires several processing steps.

It is therefore an object of the present invention to avoid the above drawbacks and to provide a method by means of which a large effective thickness of the strained silicon layer is obtained in a manner which does not complicate the processing of said layer.

To achieve this, a method of the type described in the opening paragraph is characterized in that the critical layer thickness for stress relaxation is increased by including a thin layer having a delta profile inside the strained layer.

The critical layer thickness is the thickness at which stress relaxation occurs. Above the critical layer thickness, stress relaxes and defects are formed. Stress relaxation may occur at surfaces or interfaces, e.g. between the thin layer and the strained layer.

The thin layer has a delta profile, which means that the thickness of the thin layer is only a few atomic layers. The delta profile allows the relaxation of the stress from the strained layer below a critical level. Dislocations tend to move to interfaces where they disappear and for that reason reduce the stress. As a result, a thicker strained layer may be grown, e.g. by means of epitaxial growth, before the critical level for stress relaxation is reached.

The fine-tuning of the thickness and the material of the delta profile of the thin layer allows a better control of the strain, a reduction of the stress and consequently a larger thickness of the strained layer before stress relaxation occurs.

A different material of the thin layer and the strained layer is the reason for stress, which may be tensile or compressive depending on the atom size of each of the materials.

To build up stress, the atoms of the material of the thin layer may be larger than the atoms of the material of the strained layer. For instance Ge is a larger atom than Si.

A compound of SiGe has a larger lattice distance than Si, which means that the Si strained layer is under tensile stress. As a result of the tensile stress, the Si layer is strained.

The atoms of the thin layer may also be smaller than the atoms of the material of the strained layer. For instance, Si or a compound of SiGe has a smaller lattice distance than Ge. A strained Ge layer on a thin e.g. Si or SiGe layer therefore is subjected to compressive stress.

In fact, any semiconductor material grown on a thin layer of another material is subjected to stress and as a result the semiconductor layer is strained, as long as the mismatch between the different materials is relatively small and the critical value for stress relaxation is not exceeded.

The invention also comprises a method of manufacturing a semiconductor device as described in the opening paragraph. According to the invention, the measure to avoid thickness reduction comprises that the third layer is thin and positioned within the second layer close to the interface between the first and second semiconductor layer. The invention is firstly based on the recognition that the third SiGe layer reduces the strain in the strained silicon layer and thus that a thicker strained silicon layer is possible. Furthermore, the invention is based on the recognition that positioning the third SiGe containing layer close to the interface between the strained silicon layer and the first SiGe layer is not only effective in increasing the possible thickness of the strained silicon layer but also involves no or hardly no reduction of said thickness due to the presence of said SiGe containing layer. This is caused by out-diffusion of the strain-relaxed first (SiGe) layer into the strained silicon layer during subsequent processing. Such an out-diffusion will easily be in the order of a few nm, say between 1 and 5 nm. If the third SiGe layer is positioned at a distance within that range from the interface between the first and second semiconductor layers, it will be essentially consumed by said Ge out-diffusion from the first semiconductor layer. In this way, an increased thickness of the strained silicon layer is possible without hardly any consumption thereof during subsequent out-diffusion of Ge from the underlying SiGe layer having a high(er) Ge content.

In this way, the effective thickness in which the channel of a MOSFET to be formed can be placed is increased, resulting in improved high-frequency behavior of the MOSFET since the carriers can stay at a larger distance from said interface and thus their mobility is less impaired by defects in the neighborhood of said interface.

In a preferred embodiment, the third layer is positioned within a distance from the interface that is equal to or smaller than the range of the out-diffusion of germanium from the first semiconductor layer into the second semiconductor layer during subsequent processing. In this way, the effect of the method according to the invention is optimal for various subsequent processing conditions involving different Ge out-diffusion profiles near said interface.

Preferably, the third layer is in the form of a SiGe spike which has a thickness of 1 to 5 nm and is positioned within a distance from the interface between the first and second layer of 2 to 10 nm, preferably between 2 and 5 nm. Other solutions may be suitable to obtain the same result, like intentional grading of the Ge concentration near said interface, e.g. from the concentration of the first SiGe layer of 25 to 35% to a concentration of, say, 10 at. % Ge at a distance of e.g. 4 nm from the SiGe layer.

The effect according to the invention is largest in case the effective Ge concentration of the region near the interface is lower than the Ge concentration in the first semiconductor layer. The Ge concentration in the third layer may also have a delta-like profile with a maximum concentration that is higher than that in the first semiconductor layer. Since the Ge concentration in the silicon layer that separates the third layer from the first layer is zero, the effective Ge concentration near the interface between first and second layers may still be sufficiently smaller than the Ge content of the first layer.

A suitable Ge content of the first layer is between 25 and 35 at. %. For such a concentration, both electron and hole mobility in the second (strained silicon) layer may approach their maximum value.

In a further embodiment, a fourth semiconductor layer is provided before the first layer, which fourth semiconductor layer has a lattice of a mixed crystal of silicon and germanium, of which the germanium content gradually increases from 0 at. % to the germanium content of the first semiconductor layer. In this way, the defect density in the first layer containing a high concentration of Ge may be decreased. The full advantage of the method according to the invention is realized if the subsequent processing comprises heating steps and/or ion implantations. Said steps form part of the present IC technology for manufacturing MOS transistors. The semiconductor device is preferably formed as a field effect transistor with source, drain, channel and gate regions, wherein the channel region is formed in the second semiconductor layer.

The invention also comprises a semiconductor device obtained with a method according to the invention and a semiconductor substrate suitable for use in such a method. According to the invention, such a substrate is provided with a layer structure that comprises a first semiconductor layer having a lattice of a mixed crystal of silicon and germanium and a thickness such that the lattice is substantially relaxed, and on top of the first semiconductor layer there is provided a second semiconductor layer comprising strained silicon and a third layer having a lattice of a mixed crystal of silicon and germanium, which third layer is thin and positioned within the second layer close to the interface between the first and second semiconductor layer.

Preferably, the thin layer has a delta profile. In this way, the method according to the invention can be carried out in two different steps. The first step is carried out by the manufacturer of the semiconductor substrates and the second step is carried out at the premises of an IC factory.

Figure 2:
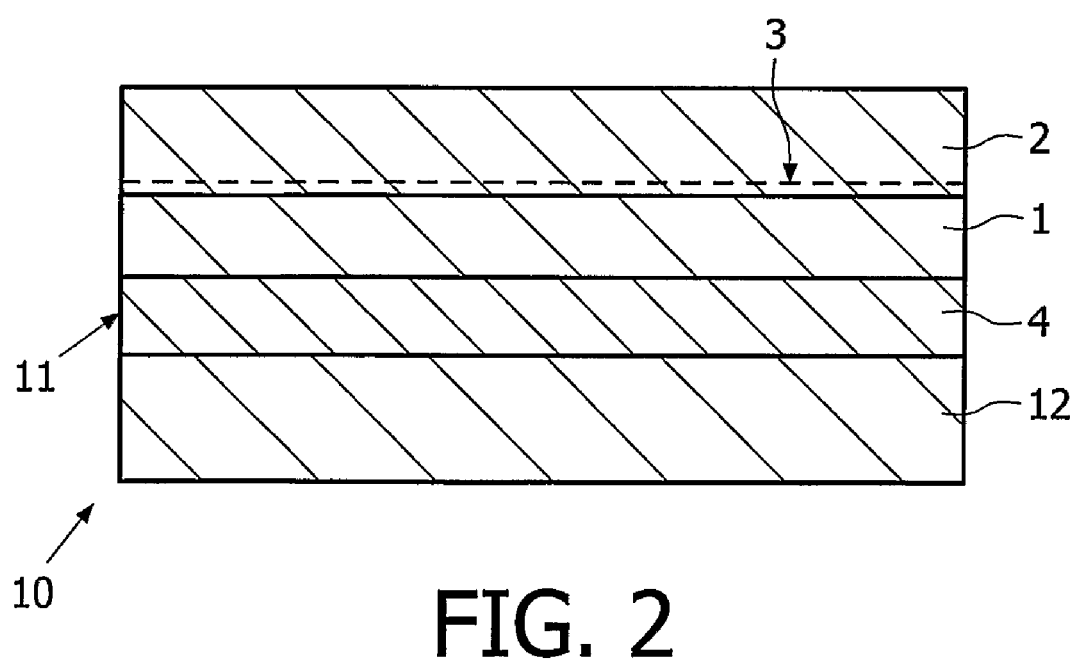
Figure 3:
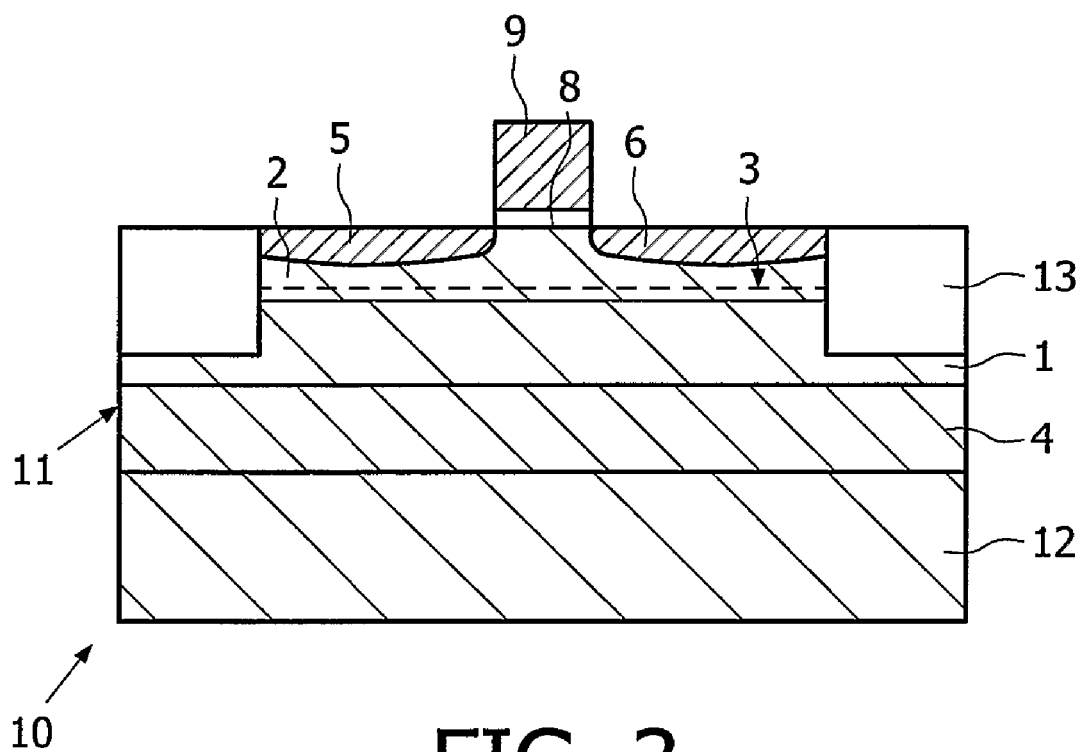
Figure 4:
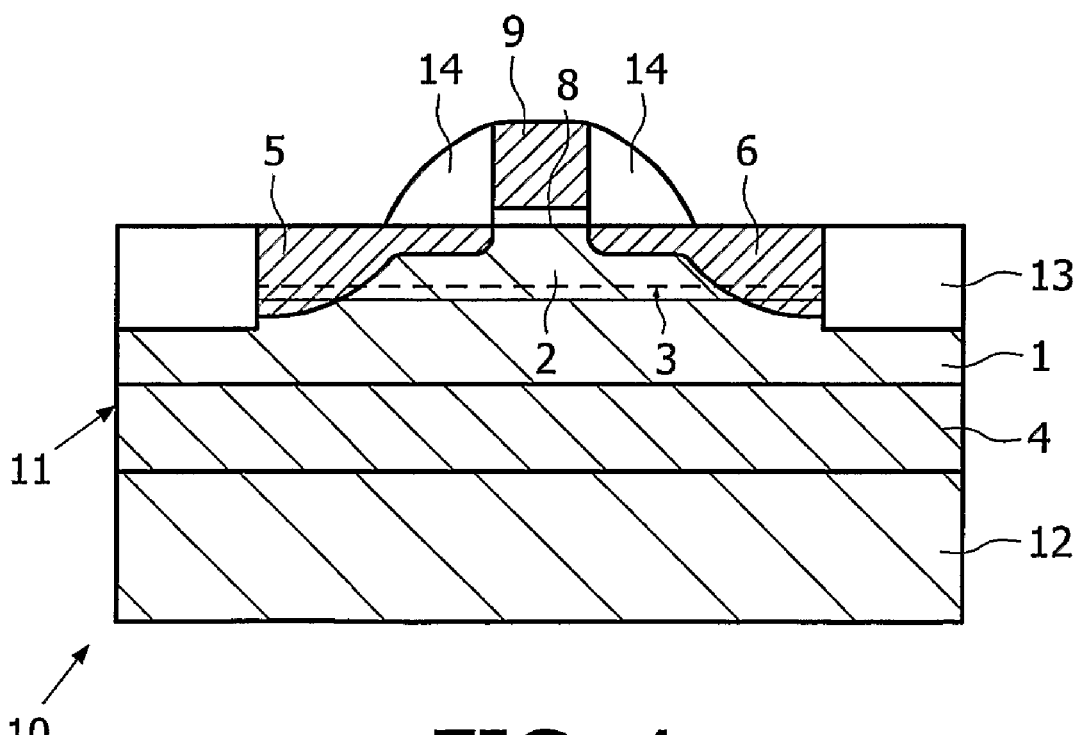
Figure 5A:
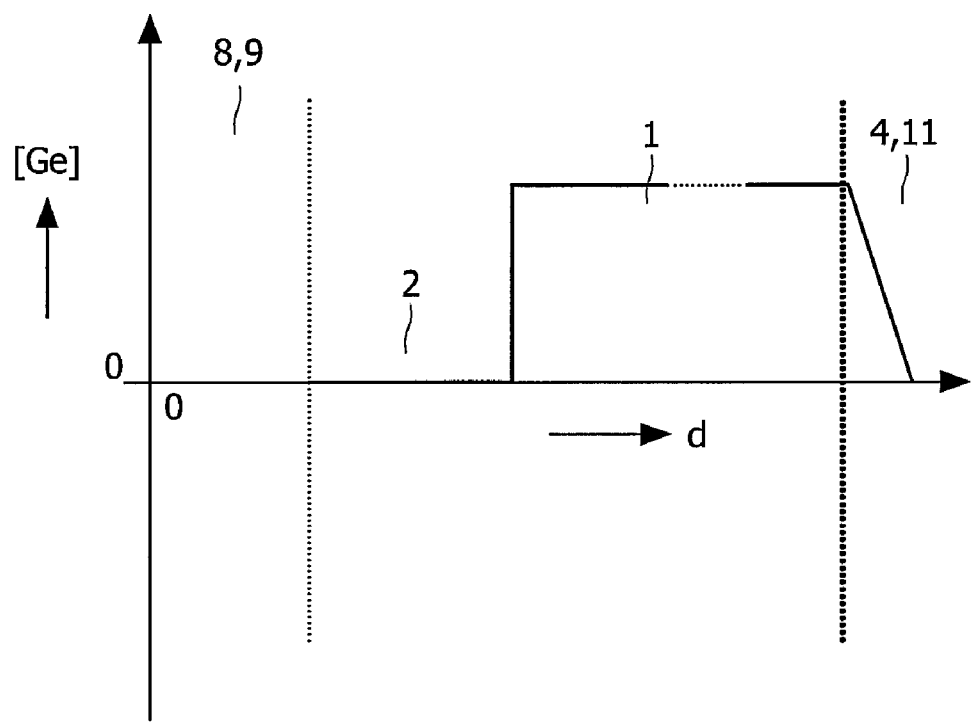
Figure 5B:
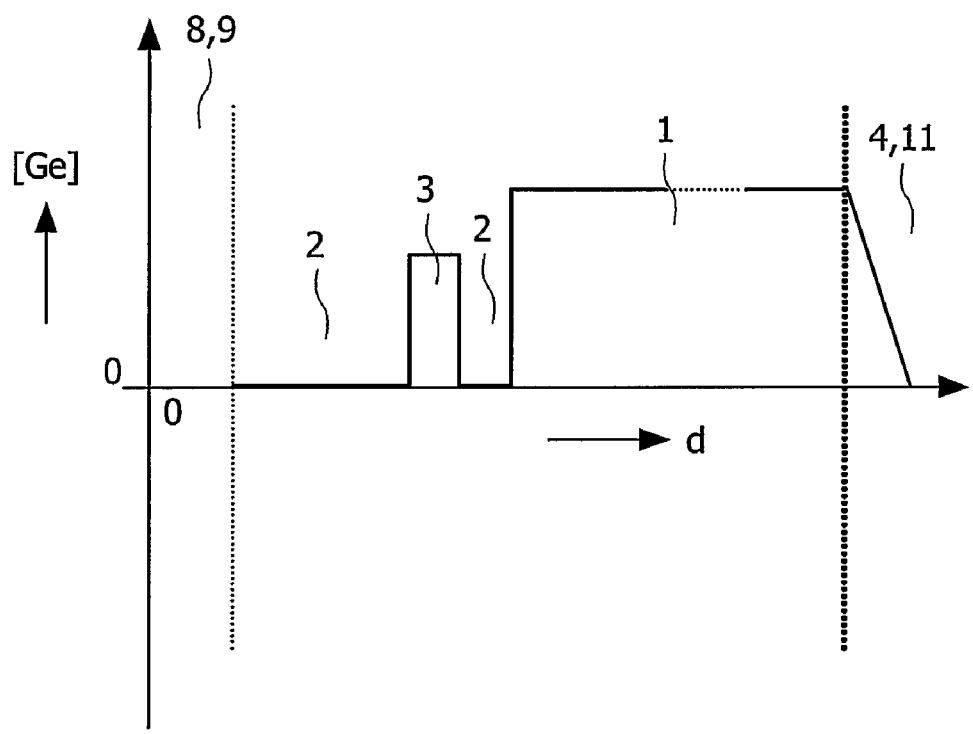
Figure 6A:
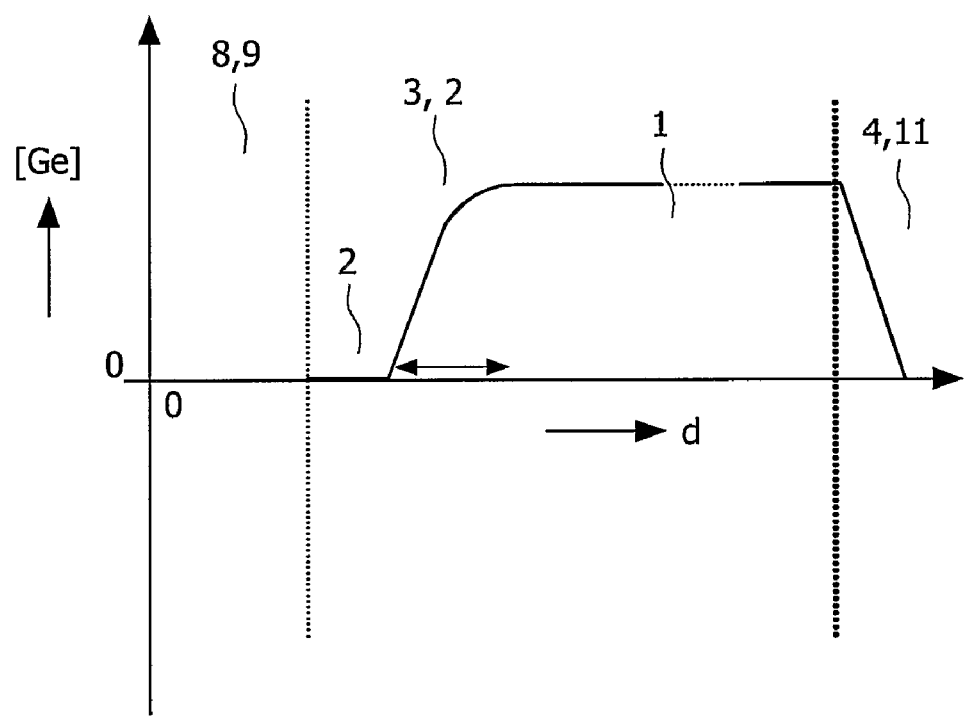
Figure 6B:
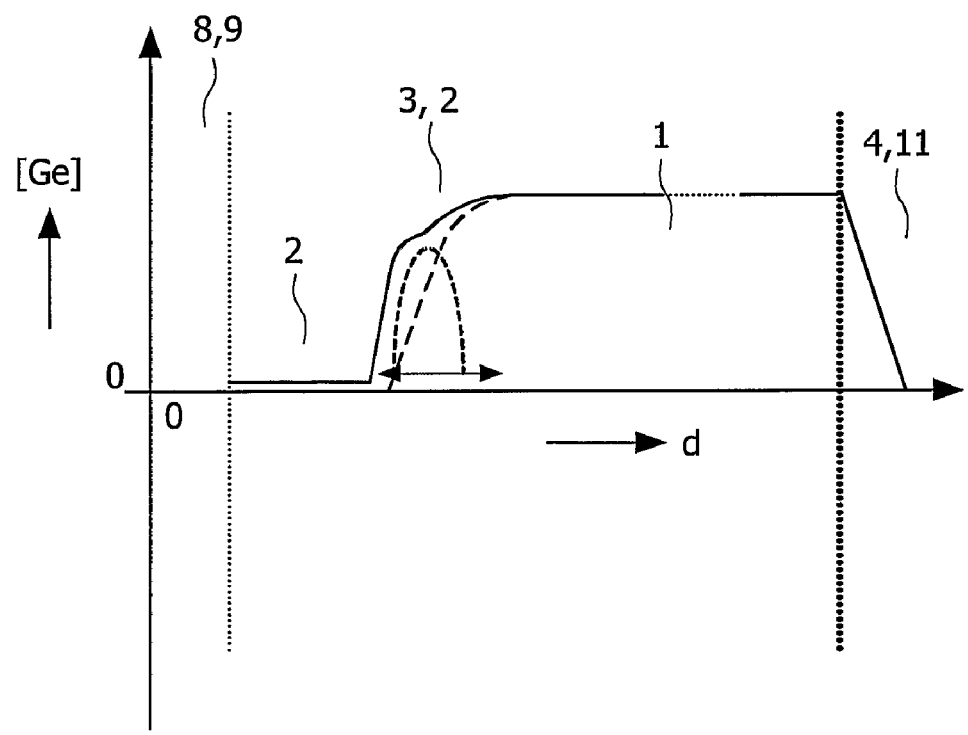

These and other aspects of the invention will be apparent from and elucidated with reference to the embodiments described hereinafter, to be read in conjunction with the drawing, in which FIG. 1 is a sectional view of a semiconductor device obtained with a method according to the invention, FIGS. 2 through 4 are sectional views of the semiconductor device of FIG. 1 at various stages in the manufacture of the device by means of a method in accordance with the invention, FIG. 5 shows the Ge concentration ([Ge]) as a function of the thickness (d) for (a) a prior art substrate structure and (b) a substrate structure according to the invention, and FIG. 6 shows the Ge concentration ([Ge]) as a function of the thickness (d) for (a) a finished prior art device and (b) a finished device obtained with a method according to the invention.

The Figures are diagrammatic and not drawn to scale, the dimensions in the thickness direction being particularly exaggerated for greater clarity. Corresponding parts are generally given the same reference numerals and the same hatching in the various Figures.

FIG. 1 is a sectional view of a semiconductor device obtained with a method according to the invention. The device 10, which in this case is a NMOST, comprises a semiconductor body 11 that is made of p-type silicon, here formed by a p-type silicon substrate 11. The device 10 contains near its borders isolation regions such as a so-called trench or LOCOS (=Local Oxidation of Silicon) isolation region 13. In practice, the device 10 will generally contain many transistors, of both the NMOS and PMOS type. At the surface of the semiconductor body are present a, in this case n-type, source region 5 and drain region 6 provided with— also n-type-extensions that are more shallow and border a, in this case p-type, channel region 7 above which a dielectric region 8 is present, here comprising silicon dioxide, which separates the channel region 7 from a gate region 9, here comprising polycrystalline silicon. Spacers 14, in this case also of silicondioxide, border the gate region 9. On top of the source, drain and gate regions 5,6,9, a metal silicide may be present functioning as a connection region. The channel region 8 is formed in a second semiconductor layer 2 comprising strained silicon which is present on top of a first semiconductor layer 1 comprising strain-relaxed SiGe with a Ge content of e.g. 30 at. % and having a thickness of e.g. 300 nm. Near the interface between the first and second semiconductor layers 1,2, a third semiconductor layer 3 comprising a SiGe spike is present having a thickness, in this example and after its deposition—of 2.5 nm and being positioned—after its deposition—at a distance of 2.5 nm from said interface. Said SiGe spike allows for a thicker strained Si layer 2 on top of the SiGe layer 1, while, after processing, substantially the same region of the strained Si layer 2 is spoiled by out-diffusion of Ge from the SiGe layer 1 by subsequent processing steps involving ion implantations and/or thermal treatments. The increase in allowable thickness of the strained Si layer 1 may be e.g. from about 8 nm to about 10.5 nm. The consumption thereof by out-diffusion is the same or increases r to a smaller extent, said consumption increasing e.g. from 6 nm to 7.5 nm. In this way, the effective thickness of the strained silicon layer obtained with a method according to the invention may be something like 3 nm (=10.5-7.5), whereas said thickness in a prior art device will be something like 2 nm (=8-6). In this way, the total thickness of the strained silicon layer 2 in which the channel region 7 of the MOSFET is formed can be relatively considerably increased.

FIGS. 2 through 4 are sectional views of the semiconductor device of FIG. 1 at various stages in the manufacture of the device by means of a method in accordance with the invention. The starting point for the manufacture of the device 10 is (see FIG. 2) a p-type silicon substrate 12 or an n-type substrate provided with a so-called p well, which may form the channel region 7 of an NMOST, which in this case also forms the semiconductor body 11. Firstly, a graded SiGe layer 4 is grown on top of the substrate 12 in a thickness of 3000 nm, of which the Ge content varies from zero to e.g. 30 at. % and which has a thickness of a few micron. At this stage a CMP (=Chemical Mechanical Polishing) step is performed in order to obtain a flat and smooth surface. Then a strain-relaxed SiGe layer 1 is grown having a thickness of e.g. 1000 nm and a Ge content of 30 at. %. On top thereof, a strained Si layer 2 is grown with a SiGe spike layer which is positioned close to the interface between the layers 1,2.

Such a semiconductor substrate structure may be formed by means of a method according to the invention or it may be formed at a different site, e.g. at the site of a wafer manufacturer.

Next, (see FIG. 3), in the surface of the body 11 isolation regions 13, e.g. as a trench isolation, are formed. Subsequently, on the surface of the silicon body 1 a gate dielectric 8 of a silicon oxide is formed, in this case by means of thermal oxidation. Next, a polycrystalline silicon layer 9 is deposited on the gate dielectric layer 6 by means of CVD (=Chemical Vapor Deposition) in a usual manner. Its thickness is, in this example, 100 nm. A mask—not shown in the drawing—is deposited on the structure at the area of the gate 9 to be formed, e.g. comprising a resist and formed by means of photolithography. Outside the mask the layers 5,6 are removed by means of etching, and in this way the gate stack, comprising gate 9 and gate dielectric 8, is formed. Using this gate region as a mask, the shallow parts of source and drain regions 5,6 of the MOST to be formed are formed in the semiconductor body 11 by means of ion implantation of e.g. P ions.

Subsequently, (see FIG. 4), spacers 14, e.g. of silicon dioxide, are formed at both sides of the gate stack by depositing a uniform layer of said material on the device 10 and by anisotropic etching thereof such that it is again removed in the planar regions of the device. Now a deeper n+ type implantation is done in order to complete source and drain regions 5,6 of the MOST. The semiconductor body is then annealed at a temperature of >1000° C. in order to activate the source and drain implantations. Source, drain and gate regions 5, 6, 9 may be provided with a metal silicide in a usual manner.

Finally, the manufacturing of the n-MOST is completed by deposition of a pre-metal dielectric, e.g. of silicon dioxide, followed by patterning thereof, deposition of a contact metal layer, e.g. of aluminum, again followed by patterning to form h contact regions. These steps are not shown in the drawing. The effect of a method according to the invention is schematically illustrated hereinbelow.

FIG. 5 shows the Ge concentration ([Ge]) as a function of the thickness (d) for (a) a prior art substrate structure and (b) a substrate structure according to the invention, and FIG. 6 shows the Ge concentration ([Ge]) as a function of the thickness (d) for (a) a finished prior art device and (b) a finished device obtained with a method according to the invention. In the prior art device, (see FIG. 6a), a strained silicon layer 2 having e.g. a thickness of 8 nm is possible before defects in said layer 2 are formed that spoil its (high-mobility) properties. The substrate structure according to the present invention has a SiGe spike 3, e.g. of 20 at. % and 2.5 nm wide positioned in the silicon layer 2 at a distance of 2.5 nm from the interface between layers 1,2. This allows e.g. a total strained silicon layer 2 to be grown having a thickness of e.g. 10.5 nm. In FIG. 6, the effects of subsequent processing to form the MOST of FIG. 1 are shown for both semiconductor substrate structures of FIG. 5. FIG. 6a shows e.g. an out-diffusion of 6 nm of Ge from the SiGe layer 1. This means that for a prior art device, after processing, the available strained silicon layer 2 has a thickness of 8-6=2 nm. For a semiconductor substrate wafer according to the invention, and using a method according to the invention, said out-diffusion of Ge is only marginally increased e.g. from 6 to 7.5 nm. The available strained silicon part in this case thus has a thickness of 10.5-7.5=3 nm. This is substantially more than in a prior art device, allowing for the manufacture of a MOST whose high-frequency properties are better.

It will be obvious that the invention is not limited to the examples described herein, and that within the scope of the invention many variations and modifications are possible to those skilled in the art.

The invention claimed is:

1. A method of manufacturing a strained semiconductor layer, the method comprising:
   forming a strained semiconductor layer having a critical layer thickness for stress relaxation, and
   forming, in the strained layer, a thin layer having a delta profile that contributes to the critical layer thickness of the strained layer characterized in that the thin layer has a thickness of 1 to 5 nm and is positioned at a distance from the interface between the first and second layers of 2 to 10 nm.

2. Method as claimed in claim 1, characterized in that the thin layer comprises a material having atoms with a larger atom size than atoms of the material of the strained layer.

3. Method as claimed in claim 1, characterized in that the thin layer comprises a material having atoms with a smaller atom size than atoms of the material of the strained layer.

4. A method of manufacturing a semiconductor device, the method comprising providing, at a surface of a semiconductor body of silicon,
   a first semiconductor layer having a lattice of a mixed crystal of silicon and germanium and a thickness such that the lattice is substantially relaxed,
   on top of the first semiconductor layer, a second semiconductor layer comprising strained silicon, in which layer part of the semiconductor device is formed, and
   a thin third layer having a lattice of a mixed crystal of silicon and germanium and positioned within the second layer close to the interface between the first and second semiconductor layers to mitigate reduction of the effective thickness of the strained silicon layer during subsequent processing needed to form the semiconductor devices wherein the third layer has a delta profile of germanium and has a thickness of 1 nm to 5 nm and is positioned at a distance from the interface between the first and second layers of 2 nm to 10 nm.

5. Method according to claim 4, characterized in that the third layer is positioned within a distance from the interface that is equal to or smaller than the range of the out-diffusion of germanium from the first semiconductor layer into the second semiconductor layer during subsequent processing.

6. Method according to claim 4, characterized in that the third layer has a germanium content that is lower than the germanium content of the first semiconductor layer.

7. Method according to claim 4, characterized in that the germanium content of the first layer is between 25% and 35%.

8. Method according to claim 4, characterized in that a fourth semiconductor layer is provided before the first layer, said fourth semiconductor layer having a lattice of a mixed crystal of silicon and germanium, of which the germanium content gradually increases from 0% to the germanium content of the first semiconductor layer.

9. Method according to claim 4, characterized in that the subsequent processing comprises at least one of heating steps and ion implantations.

10. Method according to claim 4, characterized in that the semiconductor device is formed as a field effect transistor with source, drain, channel and gate regions, and the channel region is formed in the second semiconductor layer.

11. A semiconductor device comprising:
- a strained semiconductor layer having a critical layer thickness for stress relaxation, and
- in the strained layer, a thin layer having a delta profile that contributes to the critical layer thickness of the strained layer characterized in that the thin layer has a thickness of 1 nm to 5 nm and is positioned at a distance from the interface between the first and second layers of 2 nm to 10 nm.

12. A semiconductor device comprising:
- a silicon body; and
- at a surface region of the silicon body, a layer structure having
  - a first semiconductor layer having a lattice of a mixed crystal of silicon and germanium and a thickness such that the lattice is substantially relaxed,
  - on top of the first semiconductor layer, a second semiconductor layer comprising strained silicon, and
  - a third layer having a lattice of a mixed crystal of silicon and germanium and positioned within the second layer close to an interface between the first and second semiconductor layers wherein the third layer has a delta profile of germanium and has a thickness of 1 nm to 5 nm and is positioned at a distance from the interface between the first and second layers of 2 nm to 10 nm.

13. A semiconductor device as claimed in claim 12, characterized in that the thin layer has a delta profile.

14. A semiconductor device as claimed in claim 12, characterized in that the third layer has a thickness of 1 to 5 nm and is positioned at a distance from the interface between the first and second layers of 2 to 10 nm.

15. Method as claimed in claim 1, wherein forming a thin layer having a delta profile that contributes to the critical layer thickness of the strained layer includes forming a thin layer having a thickness of less than about 5 atomic layers and having a delta profile that contributes to the critical layer thickness of the strained layer by relaxing stress in the strained layer.

16. The device of claim 11, wherein the thin layer has a thickness of less than about 5 atomic layers and is configured and arranged to relax stress in the strained layer.

17. The device of claim 12, wherein the third layer is configured and arranged to relax stress in the strained layer in which the third layer is formed.

* * * * *